(12) United States Patent
Chang (10) Patent No.: US 10,187,072 B1
(45) Date of Patent: Jan. 22, 2019

(54) SIGNAL PROCESSING SYSTEM AND METHOD THEREOF

(71) Applicant: LYRA SEMICONDUCTOR INCORPORATED, Hsinchu County (TW)

(72) Inventor: Horng-Der Chang, Hsinchu County (TW)

(73) Assignee: LYRA SEMICONDUCTOR INCORPORATED, Hsinchu County (TJ)

( * ) Notice: Subject to any disclaimer, the term of this patent is extended or adjusted under 35 U.S.C. 154(b) by 0 days.

(21) Appl. No.: 15/682,602

(22) Filed: Aug. 22, 2017

(30) Foreign Application Priority Data

Jul. 24, 2017  (TW) .............................. 106124694 A (51) Int. Cl.
  *H03L 7/107* (2006.01)
  *H03L 7/089* (2006.01)
  *H03L 7/183* (2006.01)
  *H03C 3/09* (2006.01)

(52) U.S. Cl.
  CPC ......... *H03L 7/1077* (2013.01); *H03C 3/0908* (2013.01); *H03C 3/0933* (2013.01); *H03L 7/0895* (2013.01); *H03L 7/183* (2013.01)

(58) Field of Classification Search
  CPC .......................... H03L 7/1077; H03C 3/0908
  See application file for complete search history.

(56) References Cited

U.S. PATENT DOCUMENTS

| | | | |
|---|---|---|---|
| 5,798,637 A * | 8/1998 | Kim ........................ | G05F 3/242 323/313 |
| 2008/0007365 A1* | 1/2008 | Venuti .................. | H03C 3/0925 331/179 |

\* cited by examiner

*Primary Examiner* — Daniel Puentes
(74) *Attorney, Agent, or Firm* — Lin & Associates Intellectual Property, Inc.

(57) ABSTRACT

The invention disclosed a signal processing system and method thereof, applicable to an environment providing accurate output frequency. By using the signal processing system, the stable output voltage (AMP OUT) of the error amplifier is inputted to the input of the voltage controlled oscillator (VCO), the output frequency (Fvco) of the VCO is provided to the input of fractional-N frequency divider for digital division. The output of the fractional-N frequency divider (Fo) is provided to the input of the frequency to voltage converter for frequency/voltage conversion. Then, the low pass filter is used to filter out the ripple of the output voltage (V1) of the frequency to voltage converter and the trebling jitter of the output of the fractional-N frequency divider. The signal processing system of the present invention utilizes the voltage locked loop property and digital frequency division to achieve accurate frequency output.

10 Claims, 11 Drawing Sheets

SIGNAL PROCESSING SYSTEM AND METHOD THEREOF

CROSS-REFERENCE TO RELATED APPLICATION

The present application is based on, and claims priority from, Taiwan Patent Application No. 106124694, filed Jul. 24, 2017, the disclosure of which is hereby incorporated by reference herein in its entirety.

TECHNICAL FIELD

The technical field generally relates to a signal processing system and method, and in particular, to a signal processing system and method, applicable to an environment for accurate frequency output by using voltage-locked loop and digital frequency-division to achieve accurate frequency output.

BACKGROUND

In the development of electronic products, due to the rapid evolution of semiconductor process technology, there have been powerful, complex large-scale integrated circuits. Some electronic products, such as mobile phones, tablet PCs, USB peripheral products, require single-chip applications; moreover, in the complex large-scale integrated circuit, the accurately synchronized clock signals are needed to achieve high-specification processing efficiency. Therefore, the clock generator, that is, the phase-locked loop (PLL), is widely used in the frequency synthesizer, clock and data recovery circuit, and so on.

For the known PLL, the reference frequency Fref inputted to the phase frequency detection (PFD) circuit is often generated by an external crystal oscillator or MEMS oscillator, which often results in increased power-consumption, and larger external PCB area and volume, presenting difficulty to product miniaturization and leading to increased cost.

For USB clock generator, a common structure used in USB system is to include a built-in oscillator in the chips in order to save a 12 MHz crystal oscillator, and the built-in oscillator is often an LC-tank (for low phase noise and low jitter), Ring oscillator, or RC-oscillator; however, the LC-tank type often increases device area size and power-consumption, and Ring oscillator or RC oscillator is unable to avoid phase noise and jitter, and unable to perform temperature compensation.

A general clock generator for USB system uses the USB start of frame (SOF) from the USB HOST for the digital PLL to lock the accurate frequency, and then uses the linear PLL (LPLL) to filter out the clock jitter generated by digital PLL. The major disadvantage is that the non-USB system does not have the SOF and is unable to provide the digital PLL for frequency locking and unable to obtain accurate frequency. Also, when the digital PLL performs frequency locking and calibration, a delay time for data reception will be increased, leading to practicality of the system.

In an article in IEEE Journal of Solid-State Circuits, March 2007, "A monolithic and self-referenced RF LC clock generator compliant with USB 2.0", the author, Michael S McCorquodale, disclosed how to solve the problem of frequency change from the PLL caused by XTAL due to environmental change, such as, temperature. The solution is to add a phase interpolation circuit before feeding back to the frequency divider in the PLL to shift phase to achieve adjusting the PLL output frequency at different temperatures.

However, in the above document, the LC-tank oscillator increases the device area size and power-consumption, and the temperature compensation is done by capacitor array and switches (IPTAT+ICTAT); such an analog approach is prone to fabrication process drift. The calibration of center frequency uses binary weighting capacitor array and switches, leading to a rather large area; moreover, the output clock due to LC-tank high frequency needs high power-consumption current mode circuit for frequency division.

In the $26^{th}$ International Conference on VLSI, January 2013, India, Abhirup Lahiri proposed a CMOS clock oscillator in the 30 MHz clock oscillator in 28 nm CMOS bulk process; however, the main disadvantage is that the lock signal frequency provided by the CMOS clock oscillator is a fixed frequency.

Taiwan Patent No. 1558095 titled "clock generation circuit and method" disclosed a clock generation circuit and a clock generation method to generate a clock. The clock generating circuit comprises: a reference clock generating circuit disposed in a chip for independently generating a reference clock; a temperature sensor for sensing ambient temperature to generate a temperature information; a temperature compensation module coupled to the temperature sensor for generating a temperature compensation coefficient based on the temperature information; and a clock adjusting circuit coupled to the reference clock generating circuit for generating the clock, based on the reference clock and the temperature compensation coefficient; wherein the temperature compensation module dynamically generates the temperature compensation coefficient so that the frequency of the clock approaches a target frequency and does not substantially vary with temperature. However, the temperature compensation module of the "Clock Generation Circuit and Method" of Taiwan Patent No. 1558095 generates the temperature compensation coefficient corresponding to each temperature based on the reference value and the slope, and the temperature compensation coefficient is obtained by interpolation of a value N.F for a certain temperature, in order to deduce backward to obtain the temperature compensation coefficient.

Taiwan Patent No. 1485986 "Clock signal synthesis method and apparatus" disclosed a method and apparatus of adjusting the frequency of the output clock signal to the required accuracy of the oscillation frequency. An embodiment of the method comprises the steps of: entering a calibration mode; generating a first control character to control the timing of a clock signal synthesizer; adjusting the first control character until the timing of the synthesizer is substantially within a preset range of a reference clock timing; sensing a temperature by using a temperature sensor; storing the output preset value of the first control character to a nonvolatile memory; exiting the calibration mode; using the temperature sensor to sense the temperature; and generating a second control character based on the output of the nonvolatile memory and the output of the temperature sensor to control the timing of the clock signal synthesizer. However, Taiwan Patent No. 1485986 "Clock signal synthesis method and apparatus" uses a single-point calibration and temperature compensation mechanism to maintain the frequency of the clock signal to within the accuracy range of the specified frequency under the influence of process, voltage and temperature fluctuation.

Therefore, the issues need to be addressed include how to include a built-in oscillator in the chip to replace the external crystal oscillator (XTAL) to achieve reducing data reception delay in data transmission, save system cost, adjust center frequency of the voltage controlled oscillator (VCO) digitally, and increase applicability to non-USB system without SOF.

SUMMARY

The primary object of the present invention is to provide a signal processing system and method, able to include a built-in oscillator in the chip to replace the external crystal oscillator (XTAL), applicable to non-USB system without SOF, and to achieve reducing data reception delay in data transmission.

Another object of the present invention is to provide a signal processing system and method, by using a digital approach to use fractional-N frequency divider to adjust the center frequency of VCO, applicable to non-USB system without SOF.

Yet another object of the present invention is to provide a signal processing system and method, without the external crystal oscillator and the external resistor, able to reduce number of pins of the package and save device area and volume on the PCB, as well as save power-consumption and the system cost.

Yet another object of the present invention is to provide a signal processing system and method, on the condition of accomplishing temperature compensation and center frequency adjustment, able to output different frequencies, such as, 6M, 12M, 14.31818M, 24M, and so on; able to replace the external crystal oscillator and applicable to different systems, such as, to replace 12 MHz crystal (+1 2500 ppm) in the USB1.1, or replacing 12 MHz crystal (+−500 ppm) in USB2.0.

Yet another object of the present invention is to provide a signal processing system and method, able to use PLL characteristics and digital frequency division approach to achieve accurate frequency output.

To achieve the aforementioned objects, the present invention provides a signal processing system, comprising at least: an error amplifier, a voltage-controlled oscillator (VCO), a fractional-N frequency divider, a frequency-to-voltage converter, and a low-pass filter.

Also, depending on application, the signal processing system of the present invention may comprise a temperature compensation module.

Error amplifier: the error amplifier has a positive end for inputting a reference voltage Vref, a negative end for inputting a voltage V1, Vref=V1, and Vref=Iosc/(Fo*Cref); wherein, the voltage V1 is from an output end of the low-pass filter, the reference voltage Vref and reference current Iosc are from a temperature compensation module, the frequency signal Fo is an output signal from an output end of the fractional-N frequency divider after digital frequency division by the fractional-N frequency divider, and the reference capacitor Cref is a reference capacitance of the frequency-to-voltage converter, and the error amplifier outputs a steady output voltage AMP OUT to an input end of the VCO.

VCO: the VCO receives the steady output voltage AMP OUT from the output end of the error amplifier, and the steady output voltage AMP OUT is used as a control voltage Vctrl of the VCO, and then VCO output end outputs a clock signal CKOUT to an input end of fractional-N frequency divider, the clock signal CKOUT is a frequency signal Fvco outputted by the VCO, the outputted frequency signal Fvco is provided to the input end of the fractional-N frequency divider for digital frequency division.

Fractional-N frequency divider: the fractional-N frequency divider performs digital frequency division on the frequency signal Fvco outputted by the VCO; a frequency signal Fo after digital frequency division and outputted by the fractional-N frequency divider is provided to an input end of the frequency-to-voltage converter.

Frequency-to-voltage converter: the frequency-to-voltage converter performs frequency/voltage conversion on the received frequency signal Fo from the fractional-N frequency divider to convert the frequency signal Fo to a voltage V1.

Low-pass filter: the low-pass filter receives the voltage V1 from an output end of the frequency-to-voltage converter, and filters out ripple from the voltage V1 outputted by the frequency-to-voltage converter and clock jitter outputted from the fractional-N frequency divider.

Moreover, depending on actual application, the signal processing system may comprise a temperature compensation module; the temperature compensation module is able to provide the steady reference voltage Vref and reference current Iosc, both are with temperature compensation effect and not changed with temperature; in other words, the signal processing system of the present invention is able to perform temperature compensation; therefore, by using the PLL characteristics, temperature compensation technique, and digital frequency division, the present invention can achieve accurate frequency output.

When using the signal processing system of the present invention to process signal, the first step is to perform voltage/frequency conversion; the output end of the error amplifier inputs a reference voltage Vref, and the negative end inputs a voltage V1, and the error amplifier outputs a steady output voltage AMP OUT to the input end of the VCO; when the VCO receives the steady output voltage AMP OUT (control voltage Vctrl) from the output end of the error amplifier, the VCO generates a clock signal CKOUT, the VCO has an output end to output the clock signal to an input end of the fractional-N frequency divider, and the clock signal CKOUT is a frequency signal Fvco outputted by the VCO.

Then, the next step is to perform digital frequency division: the fractional-N frequency divider performs digital frequency division to the frequency signal Fvco outputted by the VCO, and a frequency signal Fo after digital frequency division and outputted by the fractional-N frequency divider is provided to an input end of the frequency-to-voltage converter.

The next step is to perform frequency/voltage conversion: the frequency signal Fo after digital frequency division and outputted by the fractional-N frequency divider is provided to an input end of the frequency-to-voltage converter for frequency/voltage conversion; then, the low-pass filter filters out ripple from the voltage V1 outputted by the frequency-to-voltage converter and clock jitter outputted from the fractional-N frequency divider; in other words, the frequency-to-voltage converter performs frequency/voltage conversion on the received frequency signal Fo from the fractional-N frequency divider to convert the frequency signal Fo to a voltage V1; and the low-pass filter receives the voltage V1 from an output end of the frequency-to-voltage converter, and filters out ripple from the voltage V1 outputted by the frequency-to-voltage converter and clock jitter outputted from the fractional-N frequency divider.

Moreover, depending on actual application, the signal processing method of the signal processing system of the present invention may comprise a step of temperature compensation: a temperature compensation module is able to provide the steady reference voltage Vref and reference current Iosc, both are with temperature compensation effect and not changed with temperature; in other words, the signal processing system of the present invention is able to perform temperature compensation; therefore, by using the PLL characteristics, temperature compensation technique, and digital frequency division, the present invention can achieve accurate frequency output.

The foregoing will become better understood from a careful reading of a detailed description provided herein below with appropriate reference to the accompanying drawings.

BRIEF DESCRIPTION OF THE DRAWINGS

The embodiments can be understood in more detail by reading the subsequent detailed description in conjunction with the examples and references made to the accompanying drawings, wherein.

DETAILED DESCRIPTION OF THE DISCLOSED EMBODIMENTS

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
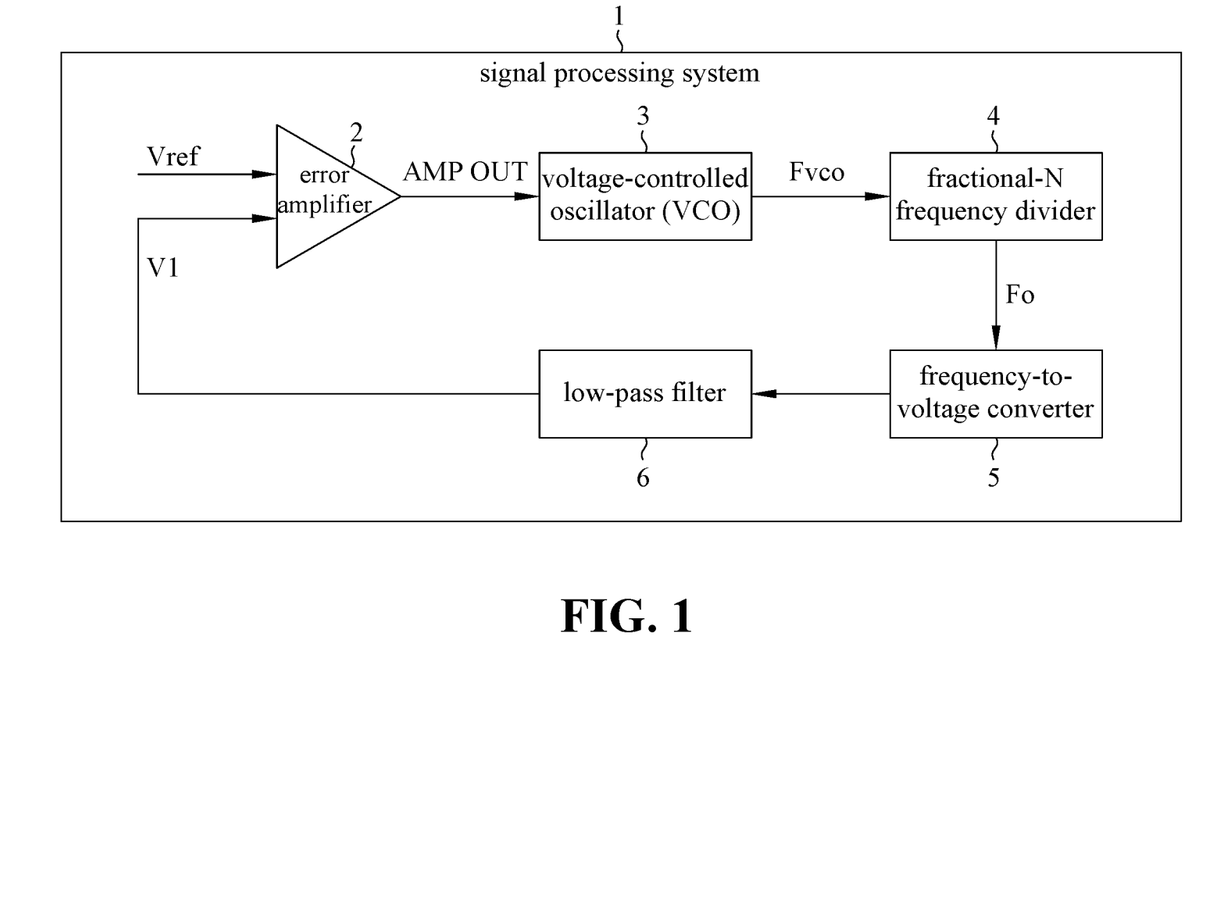
FIG. 1 shows a schematic view of the signal processing system and related operation in accordance with the present invention.

FIG. 1 shows a schematic view of the signal processing system and related operation in accordance with the present invention. As shown in FIG. 1, the signal processing system 1 comprises at least: an error amplifier 2, a voltage-controlled oscillator (VCO) 3, a fractional-N frequency divider 4, a frequency-to-voltage converter 5, and a low-pass filter 6.

Error amplifier 2: the error amplifier 2 has a positive end for inputting a reference voltage Vref, a negative end for inputting a voltage V1, Vref=V1, and Vref=Iosc/(Fo*Cref); wherein, the voltage V1 is from an output end of the low-pass filter 6, the reference voltage Vref and reference current Iosc are from a temperature compensation module (now shown), the frequency signal Fo is an output signal from an output end of the fractional-N frequency divider 4 after digital frequency division by the fractional-N frequency divider 4, and the reference capacitor Cref (not shown) is a reference capacitance of the frequency-to-voltage converter 5, and the error amplifier 2 outputs a steady output voltage AMP OUT to an input end of the VCO 3.

VCO 3: the VCO 3 receives the steady output voltage AMP OUT from the output end of the error amplifier 2, and the steady output voltage AMP OUT is used as a control voltage Vctrl (not shown) of the VCO, and then the output end of the VCO 3 outputs a clock signal CKOUT (not shown) to an input end of fractional-N frequency divider 4, the clock signal CKOUT is a frequency signal Fvco outputted by the VCO 3, and the outputted frequency signal Fvco is provided to the input end of the fractional-N frequency divider 4 for digital frequency division.

Fractional-N frequency divider 4: the fractional-N frequency divider 4 performs digital frequency division on the frequency signal Fvco outputted by the VCO 3; and a frequency signal Fo after digital frequency division and outputted by the fractional-N frequency divider 3 is provided to an input end of the frequency-to-voltage converter 5. An accumulator can be used to perform digital frequency division, such as, $Fo=Fvco*(FCW/2^{24})$, wherein FCW is a frequency controlled word, or, such as, using an N(N+1) frequency divider, $Fo=Fvco/N.f$, wherein N.f is a divider obtained by using the values of N and N+1.

Frequency-to-voltage converter 5: the frequency-to-voltage converter 5 performs frequency/voltage conversion on the received frequency signal Fo from the fractional-N frequency divider 4 to convert the frequency signal Fo to a voltage V1. The frequency-to-voltage converter 5 can be, such as, a switch capacitor circuit.

Low-pass filter 6: the low-pass filter 6 receives the voltage V1 from an output end of the frequency-to-voltage converter 5, and filters out ripple from the voltage V1 outputted by the frequency-to-voltage converter 5 and clock jitter outputted from the fractional-N frequency divider 4.

Moreover, depending on actual application, the signal processing system 1 may comprise a temperature compensation module (not shown); the temperature compensation module is able to provide the steady reference voltage Vref and reference current Iosc, both are with temperature compensation effect and not changed with temperature; in other words, the signal processing system of the present invention is able to perform temperature compensation; therefore, by using the PLL characteristics, temperature compensation technique, and digital frequency division, the present invention can achieve accurate frequency output.

The signal processing system 1 of the present invention can output different frequencies depending on actual requirements, such as, 6M, 12M, 14.31818M, 24M, and so on; and is able to replace the external crystal oscillator and applicable to different systems, such as, to replace 12 MHz crystal (+1 2500 ppm) in the USB1.1, or replace 12 MHz crystal (+−500 ppm) in USB2.0. The signal processing system 1 can use the PLL characteristics and the digital frequency division to achieve outputting accurate frequency.

Figure 2:
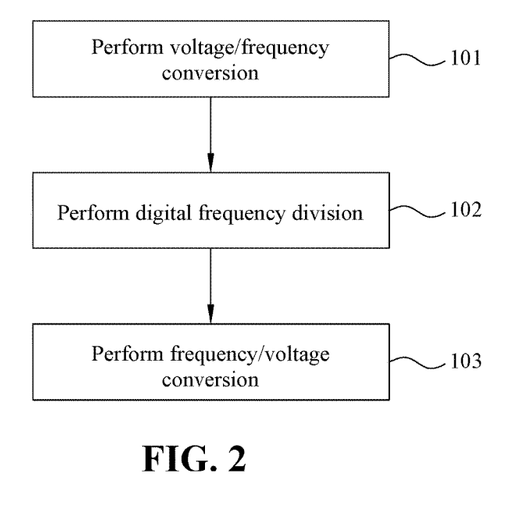
FIG. 2 shows a flowchart of the signal processing method used in the signal processing system in FIG. 1.

FIG. 2 shows a flowchart of the signal processing method used in the signal processing system in FIG. 1.

As shown in FIG. 2, step 101 is to perform voltage/frequency conversion: the output end of the error amplifier 2 inputs a reference voltage Vref, and the negative end inputs a voltage V1, and the error amplifier 2 outputs a steady output voltage AMP OUT to the input end of the VCO 3; when the VCO 3 receives the steady output voltage AMP OUT (control voltage Vctrl) from the output end of the error amplifier 2, the VCO 3 generates a clock signal CKOUT, the VCO 3 has an output end to output the clock signal to an input end of the fractional-N frequency divider 4, and the clock signal CKOUT is a frequency signal Fvco outputted by the VCO 3; and then, proceed to step 102.

Then, step 102 is to perform digital frequency division: the fractional-N frequency divider 4 performs digital frequency division to the frequency signal Fvco outputted by the VCO 3, and a frequency signal Fo after digital frequency division and outputted by the fractional-N frequency divider 4 is provided to an input end of the frequency-to-voltage converter 5; and then, proceed to step 103.

Step 103 is to perform frequency/voltage conversion: the frequency signal Fo after digital frequency division and outputted by the fractional-N frequency divider 4 is provided to an input end of the frequency-to-voltage converter 5 for frequency/voltage conversion; then, the low-pass filter 6 filters out ripple from the voltage V1 outputted by the frequency-to-voltage converter 5 and clock jitter outputted from the fractional-N frequency divider 4; in other words, the frequency-to-voltage converter 5 performs frequency/voltage conversion on the received frequency signal Fo from the fractional-N frequency divider 4 to convert the frequency signal Fo to a voltage V1; and the low-pass filter 6 receives the voltage V1 from an output end of the frequency-to-voltage converter 5, and filters out ripple from the voltage V1 outputted by the frequency-to-voltage converter 5 and clock jitter outputted from the fractional-N frequency divider 4.

Moreover, depending on actual application, the signal processing method of the signal processing system 1 of the present invention may comprise a step of temperature compensation: a temperature compensation module (not shown) is able to provide the steady reference voltage Vref and reference current Iosc, both are with temperature compensation effect and not changed with temperature; in other words, the signal processing system of the present invention is able to perform temperature compensation during processing signals; therefore, by using the PLL characteristics, temperature compensation technique, and digital frequency division, the present invention can achieve accurate frequency output.

Figure 3:
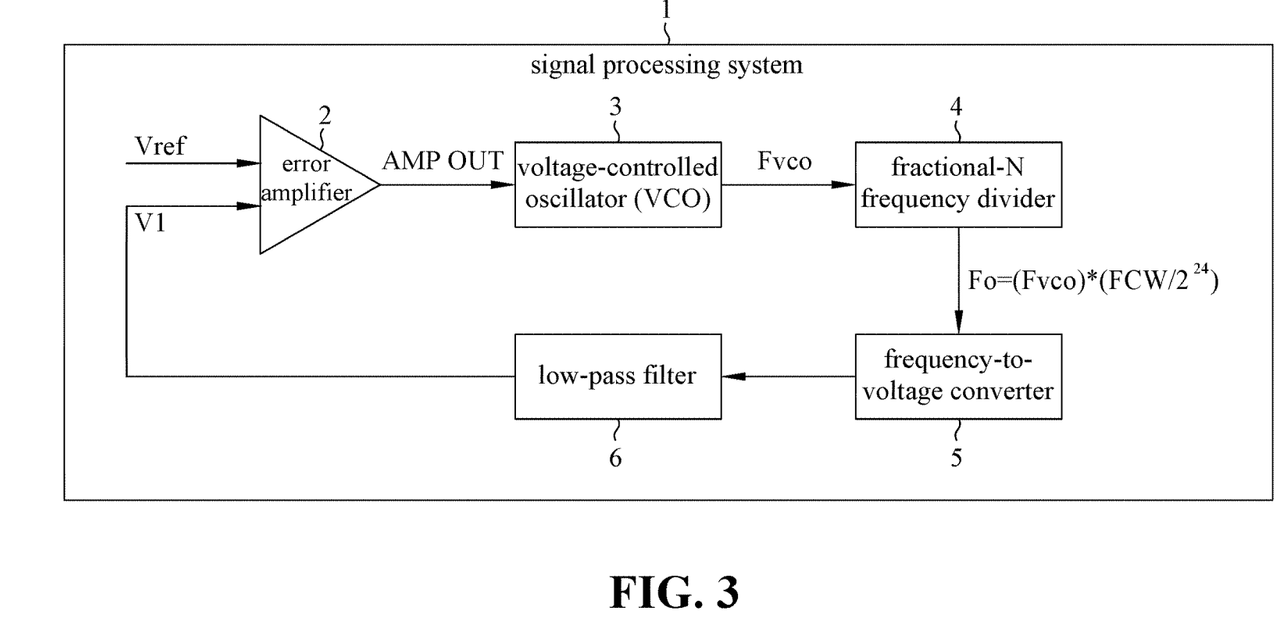
FIG. 3 shows a schematic view of the signal processing system and related operation in accordance with an exemplary embodiment of the present invention.

FIG. 3 shows a schematic view of the signal processing system and related operation in accordance with an exemplary embodiment of the present invention. As shown in FIG. 3, the signal processing system 1 comprises at least: an error amplifier 2, a voltage-controlled oscillator (VCO) 3, a fractional-N frequency divider 4, a frequency-to-voltage converter 5, and a low-pass filter 6.

Figure 6:
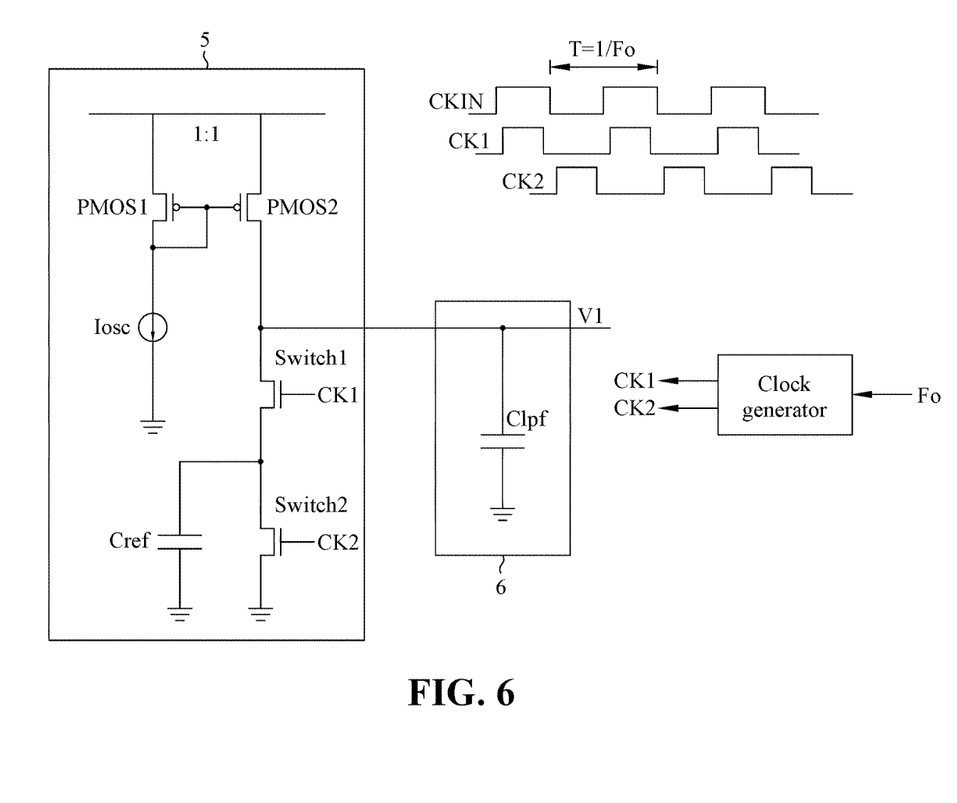
FIG. 6 shows a schematic view of an embodiment of the frequency-to-voltage converter and the low-pass filter in the signal processing system of FIG. 3.

Error amplifier 2: the error amplifier 2 has a positive end for inputting a reference voltage Vref, a negative end for inputting a voltage V1, Vref=V1, and Vref=Iosc/(Fo*Cref); wherein, the voltage V1 is from an output end of the low-pass filter 6, the reference voltage Vref and reference current Iosc are from a temperature compensation module (now shown), the frequency signal Fo is an output signal from an output end of the fractional-N frequency divider 4 after digital frequency division by the fractional-N frequency divider 4, as shown in FIG. 6, and the reference capacitor Cref (not shown) is a reference capacitance of the frequency-to-voltage converter 5, and the error amplifier 2 outputs a steady output voltage AMP OUT to an input end of the VCO 3.

Figure 4:
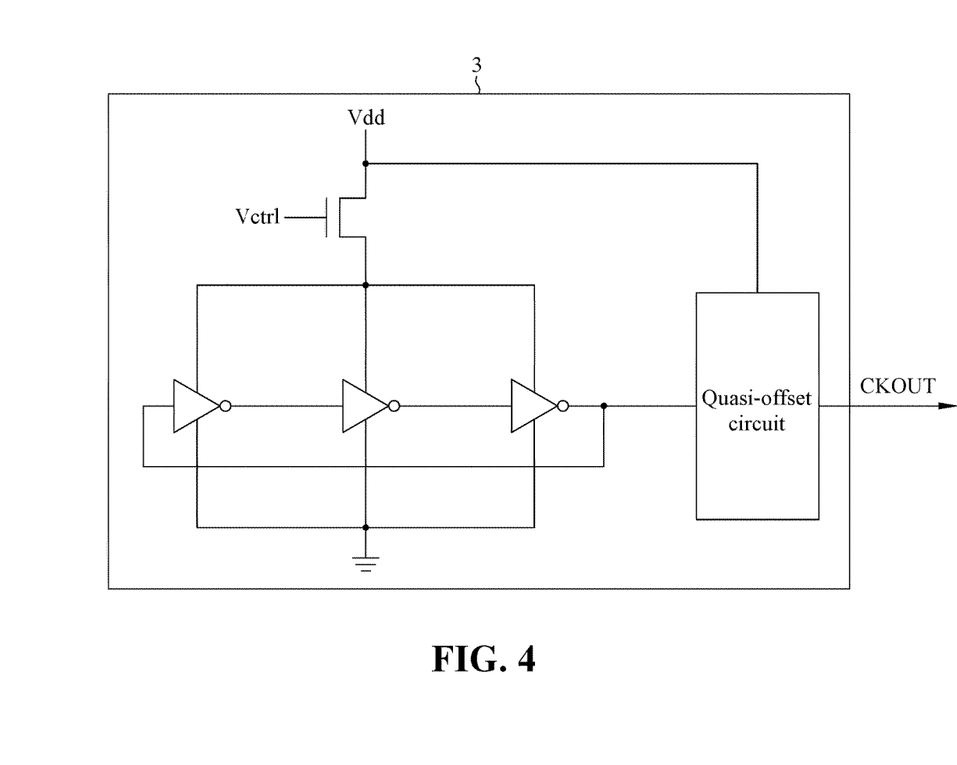
FIG. 4 shows a schematic view of an embodiment of the VCO in the signal processing system of FIG. 3.

VCO 3: the VCO 3 receives the steady output voltage AMP OUT from the output end of the error amplifier 2, and the steady output voltage AMP OUT is used as a control voltage Vctrl (not shown) of the VCO, and then the output end of the VCO 3 outputs a clock signal CKOUT, as shown in FIG. 4, to an input end of fractional-N frequency divider 4, the clock signal CKOUT is a frequency signal Fvco outputted by the VCO 3, and the outputted frequency signal Fvco is provided to the input end of the fractional-N frequency divider 4 for digital frequency division.

Moreover, as shown in FIG. 4, the VCO 3 comprises with switch/inverter circuit, and a quasi-offset circuit; wherein the voltage VDD can be, such as, 1.2V-3.3V, or 3.3V-5V; the quasi-offset circuit can transform the voltage, such as, from 1.2V to 3.3V, or from 3.3V to 5V; the frequency signal Fvco, i.e., the clock signal CKOUT outputted by the VCO 3 can have a frequency range of, such as, a few hundreds of KHz to a few hundreds of MHz.

Fractional-N frequency divider 4: the fractional-N frequency divider 4 performs digital frequency division on the frequency signal Fvco outputted by the VCO 3; and a frequency signal Fo after digital frequency division and outputted by the fractional-N frequency divider 3 is provided to an input end of the frequency-to-voltage converter 5; wherein an accumulator can be used to perform digital frequency division.

Figure 5:
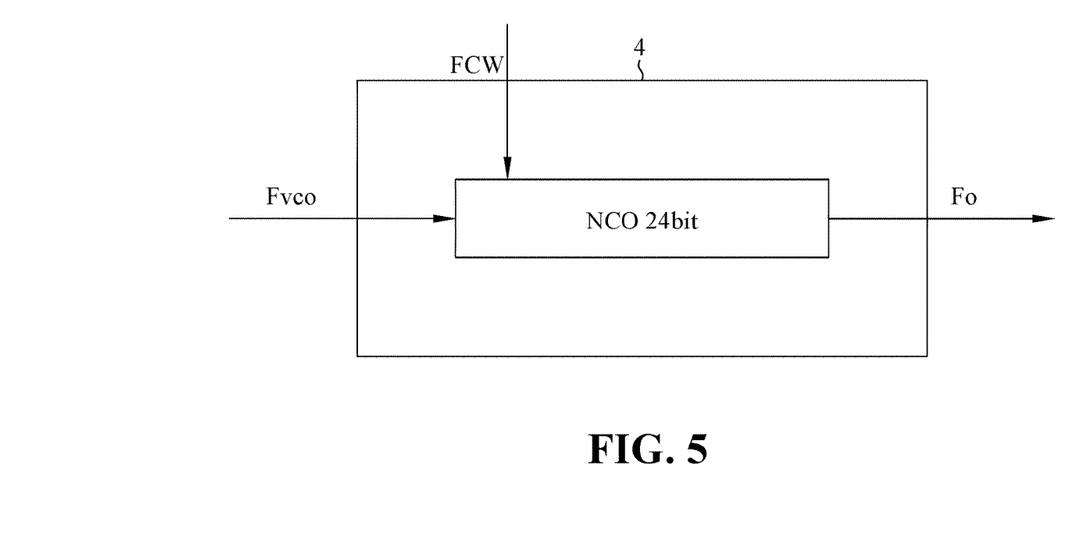
FIG. 5 shows a schematic view of an embodiment of the fractional-N frequency divider in the signal processing system of FIG. 3.

Moreover, FIG. 5 shows an embodiment circuit of the fractional-N frequency divider. As shown in FIG. 5, the fractional-N frequency divider comprises a numerical controlled oscillator NCO); for example, the NCO can be an N-bit accumulator, such as, 24 bits, and Fo=Fvco*(FCW/$2^{24}$), wherein FCW is a frequency controlled word; when the NCO is a 24 bit accumulator, the frequency signal outputted by the fractional-N frequency divider is Fo=Fvco*(A/$2^{24}$), wherein Fsys can be, such as, fsys=Fvco, and integer A can range from $2^0$ to ($2^{24}$−1). Because of digital frequency division, the present invention can obtain a plurality of accurate frequencies for output.

As shown in FIG. 6, the frequency-to-voltage converter 5 and the low-pass filter 6: the frequency-to-voltage converter 5 performs frequency/voltage conversion on the received frequency signal Fo from the fractional-N frequency divider 4 to convert the frequency signal Fo to a voltage V1. The low-pass filter 6 receives the voltage V1 from an output end of the frequency-to-voltage converter 5, and filters out ripple from the voltage V1 outputted by the frequency-to-voltage converter 5 and clock jitter outputted from the fractional-N frequency divider 4.

FIG. 4 shows a schematic view of an embodiment of the VCO in the signal processing system of FIG. 3. As shown in FIG. 4, the VCO 3 comprises with switch/inverter circuit, and a quasi-offset circuit; wherein the voltage VDD can be, such as, 1.2V-3.3V, or 3.3V-5V; the quasi-offset circuit can transform the voltage, such as, from 1.2V to 3.3V, or from 3.3V to 5V; the frequency signal Fvco, i.e., the clock signal CKOUT outputted by the VCO 3 can have a frequency range of, such as, a few hundreds of KHz to a few hundreds of MHz.

FIG. 5 shows a schematic view of an embodiment of the fractional-N frequency divider in the signal processing system of FIG. 3. As shown in FIG. 5, the fractional-N frequency divider comprises a numerical controlled oscillator (NCO); for example, the NCO can be an N-bit accumulator, such as, 24 bits, and Fo=Fvco*(FCW/$2^{24}$), wherein FCW is a frequency controlled word; when the NCO is a 24 bit accumulator, the frequency signal outputted by the fractional-N frequency divider is Fo=Fvco*(A/$2^{24}$), wherein Fsys can be, such as, fsys=Fvco, and integer A can range from $2^0$ to ($2^{24}$–1). Because of digital frequency division, the present invention can obtain a plurality of accurate frequencies for output.

FIG. 6 shows a schematic view of an embodiment of the frequency-to-voltage converter and the low-pass filter in the signal processing system of FIG. 3. As shown in FIG. 6, by using non-overlapping clock generator to transform the frequency signal Fo outputted by the fractional-N frequency divider 4 into two non-overlapping clock signals CK1 and CK2, CK1 and CK2 are provided to Switch1 and Switch 2 respectively, by using the current source Iosc, a current mirror formed by PMOS1 and PMOS2, Switch1, Switch2, and the reference capacitor Cref, the voltage V1=reference current Iosc/(frequency signal Fo*reference capacitor Cref) is obtained; i.e., V1=Iosc/(Fo*Cref). The low-pass filter 6 is used to filter out ripple from the voltage V1 outputted by the frequency-to-voltage converter 5 and clock jitter outputted from the fractional-N frequency divider 4.

Figure 7:
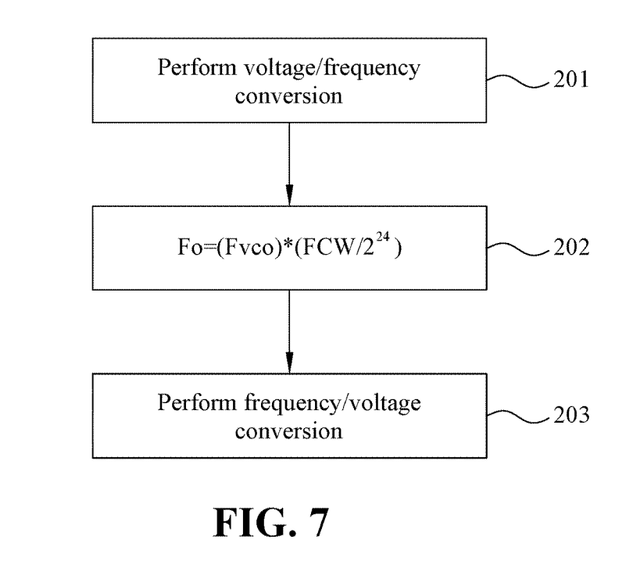
FIG. 7 shows a flowchart of the signal processing method used in the signal processing system in FIG. 3.

FIG. 7 shows a flowchart of the signal processing method used in the signal processing system in FIG. 3.

As shown in FIG. 7, step 201 is to perform voltage/frequency conversion: the output end of the error amplifier 2 inputs a reference voltage Vref, and the negative end inputs a voltage V1, and the error amplifier 2 outputs a steady output voltage AMP OUT to the input end of the VCO 3; when the VCO 3 receives the steady output voltage AMP OUT (control voltage Vctrl) from the output end of the error amplifier 2, the VCO 3 generates a clock signal CKOUT, the VCO 3 has an output end to output the clock signal to an input end of the fractional-N frequency divider 4, and the clock signal CKOUT is a frequency signal Fvco outputted by the VCO 3; and then, proceed to step 202.

Step 202 is to perform digital frequency division: the fractional-N frequency divider 4 performs digital frequency division to the frequency signal Fvco outputted by the VCO 3, and a frequency signal Fo after digital frequency division and outputted by the fractional-N frequency divider 4 is provided to an input end of the frequency-to-voltage converter 5; and then, proceed to step 203. Wherein, the fractional-N frequency divider comprises a numerical controlled oscillator (NCO); for example, the NCO can be an N-bit accumulator, such as, 24 bits, and Fo=Fvco*(FCW/$2^{24}$), wherein FCW is a frequency controlled word; when the NCO is a 24 bit accumulator, the frequency signal outputted by the fractional-N frequency divider is Fo=Fvco*(A/$2^{24}$), wherein Fsys can be, such as, fsys=Fvco, and integer A can range from $2^0$ to ($2^{24}$–1). Because of digital frequency division, the present invention can obtain a plurality of accurate frequencies for output.

Step 203 is to perform frequency/voltage conversion: the frequency signal Fo after digital frequency division and outputted by the fractional-N frequency divider 4 is provided to an input end of the frequency-to-voltage converter 5 for frequency/voltage conversion; then, the low-pass filter 6 filters out ripple from the voltage V1 outputted by the frequency-to-voltage converter 5 and clock jitter outputted from the fractional-N frequency divider 4; in other words, the frequency-to-voltage converter 5 performs frequency/voltage conversion on the received frequency signal Fo from the fractional-N frequency divider 4 to convert the frequency signal Fo to a voltage V1; and the low-pass filter 6 receives the voltage V1 from an output end of the frequency-to-voltage converter 5, and filters out ripple from the voltage V1 outputted by the frequency-to-voltage converter 5 and clock jitter outputted from the fractional-N frequency divider 4.

Figure 8:
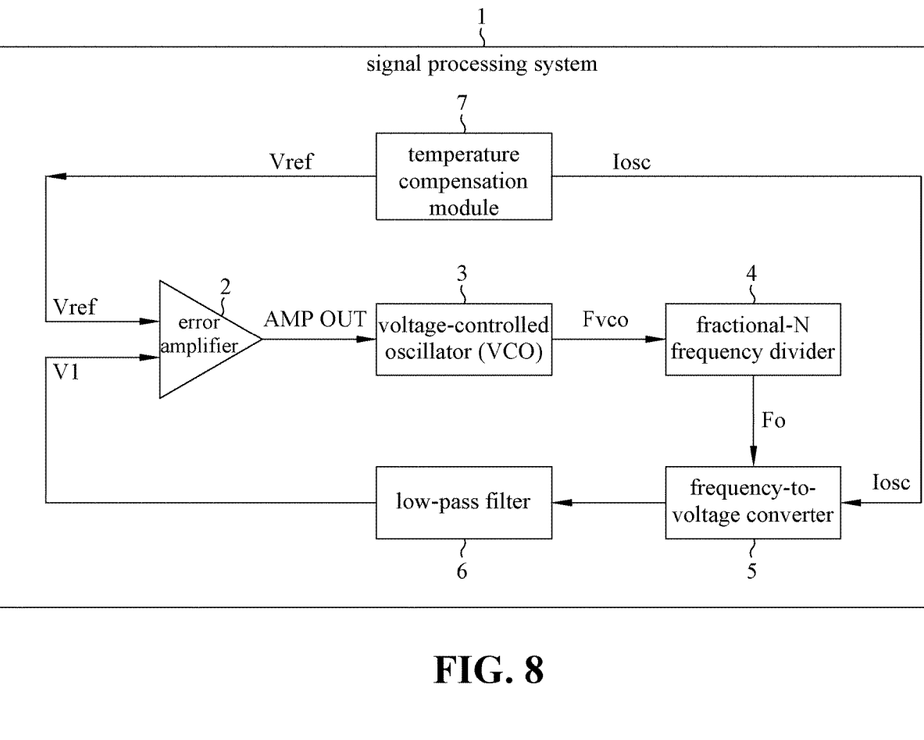
FIG. 8 shows a schematic view of the signal processing system and related operation in accordance with another exemplary embodiment of the present invention.

FIG. 8 shows a schematic view of the signal processing system and related operation in accordance with another exemplary embodiment of the present invention. As shown in FIG. 8, the signal processing system 1 comprises at least: an error amplifier 2, a voltage-controlled oscillator (VCO) 3, a fractional-N frequency divider 4, a frequency-to-voltage converter 5, and a low-pass filter 6.

Moreover, depending on actual application, the signal processing system 1 may comprise a temperature compensation module 7; the temperature compensation module 7 is able to provide the steady reference voltage Vref and reference current Iosc, both are with temperature compensation effect and not changed with temperature, to the frequency-to-voltage converter 5; in other words, the signal processing system of the present invention is able to perform temperature compensation; therefore, by using the PLL characteristics, temperature compensation technique, and digital frequency division, the present invention can achieve accurate frequency output.

Figure 10:
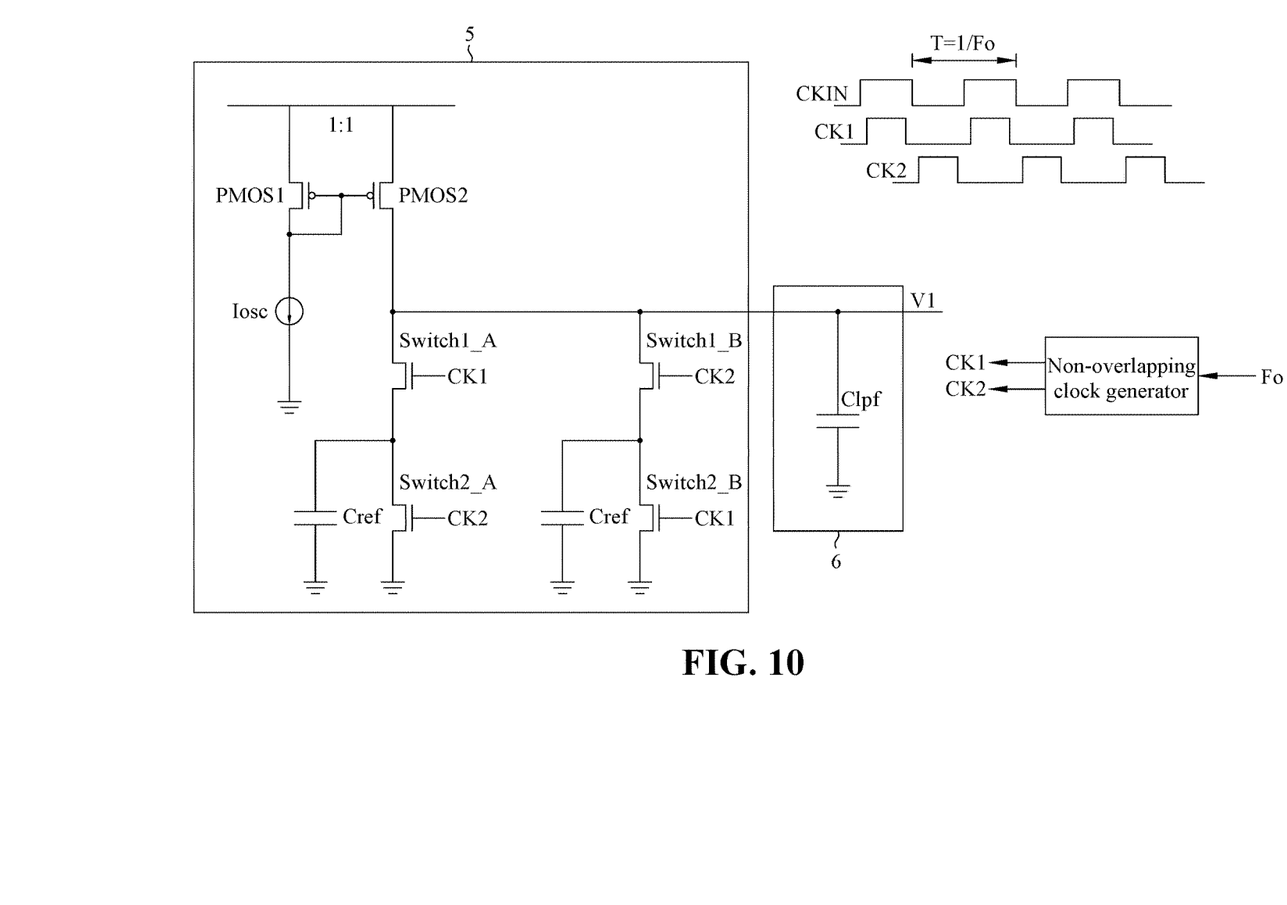
FIG. 10 shows a schematic view of an embodiment of the frequency-to-voltage converter and the low-pass filter in the signal processing system of FIG. 8.

Error amplifier 2: the error amplifier 2 has a positive end for inputting a reference voltage Vref, a negative end for inputting a voltage V1, Vref=V1, and Vref=Iosc/(Fo*Cref); wherein, the voltage V1 is from an output end of the low-pass filter 6, the reference voltage Vref and reference current Iosc are from a temperature compensation module 7, the frequency signal Fo is an output signal from an output end of the fractional-N frequency divider 4 after digital frequency division by the fractional-N frequency divider 4, as shown in FIG. 10, and the reference capacitor Cref is a reference capacitance of the frequency-to-voltage converter 5, and the error amplifier 2 outputs a steady output voltage AMP OUT to an input end of the VCO 3.

VCO 3: an implementation of the VCO 3 can be a circuit as shown in FIG. 4; therefore, the following description uses the VCO 3 in FIG. 4 as an example.

The VCO 3 receives the steady output voltage AMP OUT from the output end of the error amplifier 2, and, with the VCO 3 in FIG. 4 as an example, the steady output voltage AMP OUT is used as a control voltage Vctrl of the VCO, and then the output end of the VCO 3 outputs a clock signal CKOUT, as shown in FIG. 4, to an input end of fractional-N frequency divider 4, the clock signal CKOUT is a frequency signal Fvco outputted by the VCO 3, and the outputted frequency signal Fvco is provided to the input end of the fractional-N frequency divider 4 for digital frequency division.

Moreover, as shown in FIG. 4, the VCO 3 comprises with switch/inverter circuit, and a quasi-offset circuit; wherein the voltage VDD can be, such as, 1.2V-3.3V, or 3.3V-5V; the quasi-offset circuit can transform the voltage, such as, from 1.2V to 3.3V, or from 3.3V to 5V; the frequency signal Fvco, i.e., the clock signal CKOUT outputted by the VCO 3 can have a frequency range of, such as, a few hundreds of KHz to a few hundreds of MHz.

Fractional-N frequency divider 4: the fractional-N frequency divider 4 performs digital frequency division on the frequency signal Fvco outputted by the VCO 3; and a frequency signal Fo after digital frequency division and outputted by the fractional-N frequency divider 3 is provided to an input end of the frequency-to-voltage converter 5; wherein an N(N+1) frequency divider is used, Fo=Fvco/N.f, and N.f is a frequency divider obtained by values of N and N+1.

Figure 9:
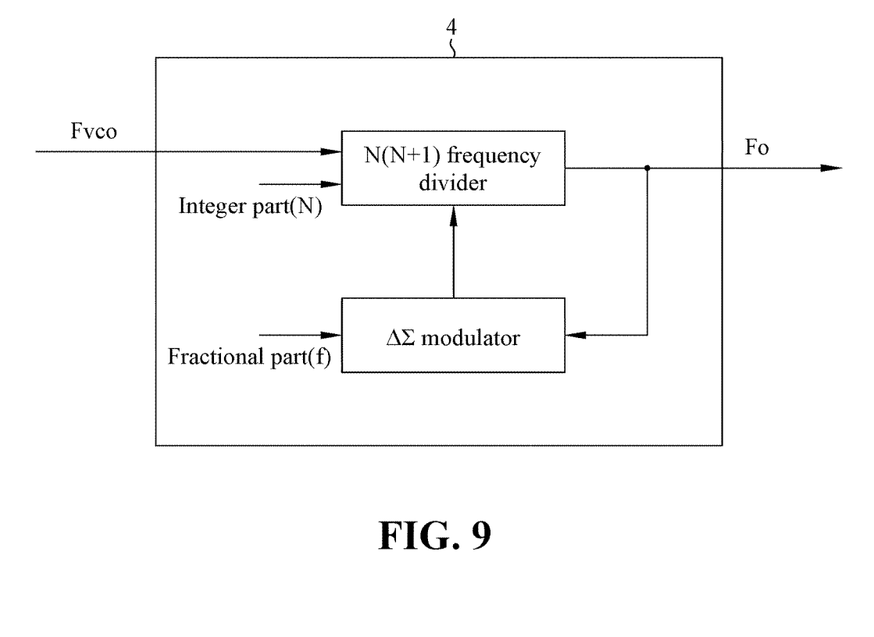
FIG. 9 shows a schematic view of an embodiment of the fractional-N frequency divider in the signal processing system of FIG. 8.

Moreover, FIG. 9 shows an embodiment circuit of the fractional-N frequency divider 4. As shown in FIG. 9, the fractional-N frequency divider 4 comprises an N(N+1) frequency divider is used, Fo=Fvco/N.f, and N.f is a frequency divider obtained by values of N and N+1; wherein, ΔΣ modulator (Sigma-Delta Modulator) uses the fractional part f and Fo to pass the values to the N(N+1) frequency divider, and the N(N+1) frequency divider uses the integer part N and the values to perform digital frequency division, wherein to perform non-integer frequency division, such as, a 3.3 frequency division, the ratio of N=3 and N+1=4 will be used to constitute the non-integer 3.3 frequency division. Therefore, the present invention can obtain a plurality of accurate frequencies for output.

As shown in FIG. 10, the frequency-to-voltage converter 5 and the low-pass filter 6: the frequency-to-voltage converter 5 performs frequency/voltage conversion on the received frequency signal Fo from the fractional-N frequency divider 4 to convert the frequency signal Fo to a voltage V1. The low-pass filter 6 receives the voltage V1 from an output end of the frequency-to-voltage converter 5, and filters out ripple from the voltage V1 outputted by the frequency-to-voltage converter 5 and clock jitter outputted from the fractional-N frequency divider 4.

FIG. 9 shows a schematic view of an embodiment of the fractional-N frequency divider in the signal processing system of FIG. 8. As shown in FIG. 9, the fractional-N frequency divider 4 comprises an N(N+1) frequency divider is used, Fo=Fvco/N.f, and N.f is a frequency divider obtained by values of N and N+1; wherein, ΔΣ modulator (Sigma-Delta Modulator) uses the fractional part f and Fo to pass the values to the N(N+1) frequency divider, and the N(N+1) frequency divider uses the integer part N and the values to perform digital frequency division, wherein to perform non-integer frequency division, such as, a 3.3 frequency division, the ratio of N=3 and N+1=4 will be used to constitute the non-integer 3.3 frequency division. Therefore, the present invention can obtain a plurality of accurate frequencies for output.

FIG. 10 shows a schematic view of an embodiment of the frequency-to-voltage converter and the low-pass filter in the signal processing system of FIG. 8. As shown in FIG. 10, by using non-overlapping clock generator to transform the frequency signal Fo outputted by the fractional-N frequency divider 4 into two non-overlapping clock signals CK1 and CK2, CK1 is provided to Switch1_A and Switch2_B respectively, and CK2 is provided to Switch1_B and Switch2_A, respectively. By using the current source Iosc, a current mirror formed by PMOS1 and PMOS2, Switch1_A, Switch1_B, Switch2_A, Switch2_B, and the reference capacitor Cref, the voltage V1=reference current Iosc/(frequency signal Fo*reference capacitor Cref) is obtained; i.e., V1=Iosc/(Fo*Cref). The low-pass filter 6 is used to filter out ripple from the voltage V1 outputted by the frequency-to-voltage converter 5 and clock jitter outputted from the fractional-N frequency divider 4.

Figure 11:
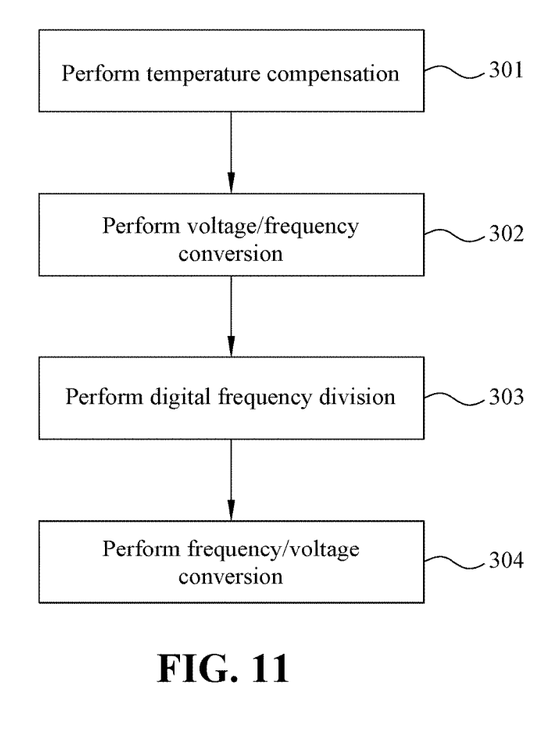
FIG. 11 shows a flowchart of the signal processing method used in the signal processing system in FIG. 8.

FIG. 11 shows a flowchart of the signal processing method used in the signal processing system in FIG. 8.

As shown in FIG. 11, step 301 is to perform temperature compensation: the temperature compensation module 7 provides the steady reference voltage Vref and reference current Iosc, both are with temperature compensation effect and not changed with temperature, to the frequency-to-voltage converter 5; and proceed to step 302. In other words, the signal processing system of the present invention is able to perform temperature compensation; therefore, by using the PLL characteristics, temperature compensation technique, and digital frequency division, the present invention can achieve accurate frequency output.

Step 302 is to perform voltage/frequency conversion: the output end of the error amplifier 2 inputs a reference voltage Vref, and the negative end inputs a voltage V1, and the error amplifier 2 outputs a steady output voltage AMP OUT to the input end of the VCO 3; when the VCO 3 receives the steady output voltage AMP OUT (control voltage Vctrl) from the output end of the error amplifier 2, the VCO 3 generates a clock signal CKOUT, the VCO 3 has an output end to output the clock signal to an input end of the fractional-N frequency divider 4, and the clock signal CKOUT is a frequency signal Fvco outputted by the VCO 3; and then, proceed to step 303.

Step 303 is to perform digital frequency division: the fractional-N frequency divider 4 performs digital frequency division to the frequency signal Fvco outputted by the VCO 3, and a frequency signal Fo after digital frequency division and outputted by the fractional-N frequency divider 4 is provided to an input end of the frequency-to-voltage converter 5; and then, proceed to step 304. Wherein, the ΔΣ modulator uses the fractional part f and Fo to pass the values to the N(N+1) frequency divider, and the N(N+1) frequency divider uses the integer part N and the values to perform digital frequency division.

Step 304 is to perform frequency/voltage conversion: the frequency signal Fo after digital frequency division and outputted by the fractional-N frequency divider 4 is provided to an input end of the frequency-to-voltage converter 5 for frequency/voltage conversion; then, the low-pass filter 6 filters out ripple from the voltage V1 outputted by the frequency-to-voltage converter 5 and clock jitter outputted from the fractional-N frequency divider 4; in other words, the frequency-to-voltage converter 5 performs frequency/voltage conversion on the received frequency signal Fo from the fractional-N frequency divider 4 to convert the frequency signal Fo to a voltage V1; and the low-pass filter 6 receives the voltage V1 from an output end of the frequency-to-voltage converter 5, and filters out ripple from the voltage V1 outputted by the frequency-to-voltage converter 5 and clock jitter outputted from the fractional-N frequency divider 4.

The VCO, fractional-N frequency divider, frequency-to-voltage converter, and low-pass filter in the embodiment of the signal processing system in FIG. 3 and the embodiment in FIG. 8 can be implemented in other equivalent circuits, and the detailed description will not be repeated here.

In summary, the signal processing system and method of the present invention is applicable to an environment providing accurate output frequency. By using the signal processing system, the stable output voltage (AMP OUT) of the error amplifier is inputted to the input of the voltage controlled oscillator (VCO), the output frequency (Fvco) of the VCO is provided to the input of fractional-N frequency divider for digital division. The output of the fractional-N frequency divider (Fo) is provided to the input of the frequency to voltage converter for frequency/voltage conversion. Then, the low pass filter is used to filter out the ripple of the output voltage (V1) of the frequency to voltage converter and the trebling jitter of the output of the fractional-N frequency divider. The signal processing system of the present invention utilizes the voltage locked loop property and digital frequency division to achieve accurate frequency output. The present invention provides the following advantages:

1. able to include a built-in oscillator in the chip to replace the external crystal oscillator (XTAL), applicable to non-USB system without SOF, and to achieve reducing data reception delay in data transmission.

2. by using a digital approach to use fractional-N frequency divider to adjust the center frequency of VCO, applicable to non-USB system without SOF.

3. without the external crystal oscillator and the external resistor, able to reduce number of pins of the package and save device area and volume on the PCB, as well as save power-consumption and the system cost.

4. on the condition of accomplishing temperature compensation and center frequency adjustment, able to output different frequencies, such as, 6M, 12M, 14.31818M, 24M, and so on; able to replace the external crystal oscillator and applicable to different systems, such as, to replace 12 MHz crystal (+1 2500 ppm) in the USB1.1, or replacing 12 MHz crystal (+−500 ppm) in USB2.0.

5. able to use PLL characteristics and digital frequency division approach to achieve accurate frequency output.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A signal processing method, applicable to an environment providing accurate frequency output, comprising the following steps:
performing voltage/frequency conversion: outputting a steady output voltage, generating a clock signal when receiving the steady output voltage, and the clock signal being a frequency signal Fc;
performing digital frequency division: performing digital frequency division on the frequency signal Fc using a fractional-N frequency divider with an N-bit accumulator;
and outputting a frequency signal Fo=Fc*(A/$2^N$) obtained by the digital frequency division with A being in a range from $2^0$ to ($2^N$−1); and
performing frequency/voltage conversion: performing frequency/voltage conversion on the outputted frequency signal Fo obtained by the digital frequency division, and filtering out ripple from a voltage outputted by the conversion and jitter from the clock signal.

2. The signal processing method as claimed in claim 1, further comprising the following processes:
performing temperature compensation: providing a steady reference voltage and a steady reference current, both with temperature compensation capability and independent of temperature; and using the reference voltage and reference current to obtain the steady output voltage.

3. The signal processing method as claimed in claim 1, wherein the outputted frequency signal Fo is at least one of the 6 MHz, 12 MHz, 14.31818 MHz, and 24 MHz.

4. The signal processing method as claimed in claim 2, wherein the outputted frequency signal Fo is at least one of the 6 MHz, 12 MHz, 14.31818 MHz, and 24 MHz.

5. The signal processing method as claimed in claim 3, wherein the step of performing frequency/voltage conversion is performed by a switch capacitor circuit.

6. A signal processing system, applicable to an environment providing accurate frequency output, comprising:
an error amplifier, for outputting a steady output voltage;
a voltage-controlled oscillator (VCO), the VCO having an output end generating a clock signal when the VCO receives the steady output voltage, and the clock signal being a frequency signal Fc;
a fractional-N frequency divider, the fractional-N frequency divider having an N-bit accumulator and performing digital frequency division on the frequency signal Fc outputted from the output end of the VCO, after digital frequency division, the fractional-N frequency divider outputting a frequency signal Fo=Fc*(A/$2^N$), with A being in a range from $2^0$ to ($2^N$−1);
a frequency-to-voltage converter, the frequency signal Fo outputted from the fractional-N frequency divider being provided to an input end of the frequency-to-voltage converter for frequency/voltage conversion; and
a low-pass filter, for filtering out ripple from a voltage outputted by the conversion and jitter from the clock signal.

7. The signal processing system as claimed in claim 6, further comprising:
a temperature compensation module, the temperature compensation module being able to provide the steady reference voltage and reference current, with temperature compensation capability and independent of temperature; and the error amplifier having a positive end receiving the reference voltage, a negative end receiving another voltage related to the reference current, and the error amplifier outputting the steady output voltage.

8. The signal processing system as claimed in claim 6, wherein the outputted frequency signal Fo is at least one of the 6 MHz, 12 MHz, 14.31818 MHz, and 24 MHz.

9. The signal processing system as claimed in claim 7, wherein the outputted frequency signal Fo is at least one of the 6 MHz, 12 MHz, 14.31818 MHz, and 24 MHz.

10. The signal processing system as claimed in claim 8, wherein the frequency-to-voltage converter uses a switch capacitor circuit to perform frequency/voltage conversion.

* * * * *